(12) United States Patent
Toyoda et al.

(10) Patent No.: US 8,977,034 B2
(45) Date of Patent: Mar. 10, 2015

(54) PATTERN SHAPE EVALUATION METHOD AND PATTERN SHAPE EVALUATION APPARATUS

(75) Inventors: Yasutaka Toyoda, Mito (JP); Ryoichi Matsuoka, Yotsukaido (JP)

(73) Assignee: Hitachi High-Technologies Corporation, Tokyo (JP)

( * ) Notice: Subject to any disclaimer, the term of this patent is extended or adjusted under 35 U.S.C. 154(b) by 155 days.

(21) Appl. No.: 13/381,629

(22) PCT Filed: Jun. 29, 2010

(86) PCT No.: PCT/JP2010/061039
§ 371 (c)(1),
(2), (4) Date: Dec. 29, 2011

(87) PCT Pub. No.: WO2011/001967
PCT Pub. Date: Jan. 6, 2011

(65) Prior Publication Data
US 2012/0106826 A1    May 3, 2012

(30) Foreign Application Priority Data
Jun. 30, 2009   (JP) ................................. 2009-155787

(51) Int. Cl.
*G06K 9/00* (2006.01)
*G01B 15/04* (2006.01)
*H01L 21/66* (2006.01)

(52) U.S. Cl.
CPC .............. *G01B 15/04* (2013.01); *H01L 22/12* (2013.01)
USPC ........................................................ 382/145

(58) Field of Classification Search
CPC ............................................. G06T 2207/30141
See application file for complete search history.

(56) References Cited

U.S. PATENT DOCUMENTS

| | | | |
|---|---|---|---|
| 7,660,455 B2 | 2/2010 | Yamamoto et al. | |
| 2002/0028012 A1* | 3/2002 | Honda | 382/145 |
| 2003/0164942 A1* | 9/2003 | Take | 356/237.2 |
| 2005/0169514 A1* | 8/2005 | Prince | 382/150 |
| 2006/0067570 A1* | 3/2006 | Onishi et al. | 382/147 |
| 2008/0069432 A1* | 3/2008 | Hsu et al. | 382/145 |
| 2008/0298670 A1* | 12/2008 | Nakagaki et al. | 382/149 |

FOREIGN PATENT DOCUMENTS

| | | | |
|---|---|---|---|
| JP | 07-225195 A | 8/1995 | |
| JP | 07-260699 A | 10/1995 | |
| JP | 9-281056 A | 10/1997 | |
| JP | 10-312461 A | 11/1998 | |
| JP | 2000-340496 A | 12/2000 | |
| JP | 2001-338304 A | 12/2001 | |
| JP | 2002-006479 A | 1/2002 | |
| JP | 2008-118033 A | 5/2008 | |
| JP | 2009-141124 A | 6/2009 | |

* cited by examiner

*Primary Examiner* — Bhavesh Mehta
*Assistant Examiner* — Andrew Moyer
(74) *Attorney, Agent, or Firm* — Miles & Stockbridge P.C.

(57) ABSTRACT

An image of the joint portion of circuit patterns manufactured using a design pattern for double patterning is read out. Target boundary lines and evaluation regions are set on the image. In the evaluation regions, image processing is performed along the directions of the target boundary lines. Furthermore, binarization processing is performed. A decision is made based on an image obtained in this way as to whether the patterns have defects.

13 Claims, 8 Drawing Sheets

PATTERN SHAPE EVALUATION METHOD AND PATTERN SHAPE EVALUATION APPARATUS

TECHNICAL FIELD

The present invention relates to a pattern shape evaluation method for evaluating whether the shape of a pattern is good or bad from a microscope image of the pattern and also to a pattern shape evaluation apparatus.

BACKGROUND ART

With the purpose of improving the performance of semiconductor devices or reducing the manufacturing costs, higher-density integration of semiconductor devices is in progress. In order to realize the higher-density integration of semiconductor devices, improvement of lithography technology is necessary. Lithography is a technique for patterning a mask for a circuit pattern in photosensitive resin (hereinafter referred to as resist) applied onto a silicon wafer by the use of an exposure apparatus. The trend toward finer dimensions in lithography has been maintained by improvements of exposure technology and resist materials.

However, in recent years, higher densities of circuit patterns are further in progress. For example, patterning with a half pitch of 32 nm is necessitated. Therefore, a patterning technique different from the prior art is indispensable. Accordingly, double patterning techniques are being developed. In the double patterning technology, one layer of circuit pattern is divided into plural (e.g., two) circuit patterns of lower circuit pattern density, and their respective masks are prepared. Using these masks, patterning is successively performed on the same region on a silicon wafer. Consequently, plural circuit patterns are successively generated in the same region on the silicon wafer. The plural circuit patterns are joined together at a joint portion and a microscopic circuit pattern of high density is fabricated.

When the double patterning technology is used, a joint portion is always formed between the circuit patterns. A deviation of the joint portion greatly affects the wafer fabrication yield. Therefore, semiconductor measuring apparatus and inspection apparatus are required to measure the amount of deviation of the joint portion between the circuit patterns or evaluate the shape of the joint portion of the pattern and to make an accurate decision as to whether the two patterns have been normally coupled together. Especially, pattern joint portions are formed in large amounts on wafers. Therefore, the shapes of the pattern joint portions are required to be evaluated efficiently by a simple method.

Methods described in Patent literatures 1-4 are available as methods used for evaluation of the shapes of the pattern joint portions. In a common manner to these methods, a shot image of a pattern to be evaluated and a pattern shape (hereinafter referred to as the reference pattern) produced in a case where the pattern is normally formed are compared, and a portion of different shape is detected as a defect. As the reference pattern, a design pattern corresponding to the pattern to be inspected or a good-quality pattern fabricated on the wafer is used.

CITATION LIST

Patent Literatures

PATENT LITERATURE 1: Japanese Patent Application Ser. No. H6-49264 Official Bulletin
PATENT LITERATURE 2: JP-A-10-312461
PATENT LITERATURE 3: JP-A-2002-6479
PATENT LITERATURE 4: JP-A-2001-338304

SUMMARY OF INVENTION

Technical Problem

In the techniques disclosed in these patent literatures, edges or contour of a pattern extracted from an image of a pattern to be inspected is compared with a reference pattern. Therefore, with respect to a low-quality image from which edges or contour cannot be extracted easily, the shape of the pattern cannot be evaluated precisely. Especially, in a case where a pattern is imaged by a scanning electron microscope (hereinafter abbreviated as SEM), random noises intrinsic in the SEM may be superimposed on the image. Furthermore, the wafer surface may be electrically charged by electron beam irradiation. In such a case, the image quality is deteriorated severely, making it difficult to extract edges or contour. In addition, with respect to a defect produced near the bottom of a pattern, it is imaged as a pattern of quite low contrast, thus making it difficult to extract the edges or contour of that portion. Therefore, there is a possibility that the joint portion between the patterns producing defects will be judged as a normal pattern.

Furthermore, in these techniques, a pattern to be inspected is compared with a reference pattern. Therefore, the processing for evaluating the shape of the pattern is complicated and the processing time is prolonged. Accordingly, there is another problem that it is difficult to perform a verifying operation in a short time.

It is an object of the present invention to provide a pattern shape evaluation method and apparatus capable of achieving pattern shape evaluation precisely at high speed.

Solution to Problem

According to the present invention, an image of a joint portion between circuit patterns fabricated using a design pattern for double patterning is read out, and target boundary lines and evaluation regions are set thereon. In the evaluation regions, image processing is performed along the directions of the target boundary lines. Furthermore, binarization processing is performed. A decision is made based on the image obtained in this way as to whether or not there is a defect in the patterns.

Advantageous Effects of Invention

According to the present invention, precise and quick evaluation of pattern shapes can be accomplished.

Other objects, features and advantages of the present invention will become apparent from the following description of the embodiment of the invention provided in connection with the accompanying drawings.

DESCRIPTION OF EMBODIMENTS

Embodiments of the present invention are described with reference to the drawings. A method of evaluating the shape of a circuit pattern formed by semiconductor manufacturing steps is hereinafter described regarding the present invention. The invention is also applicable to pattern shape evaluation in other industrial fields. The term "double patterning" used in the present specification means a technique for fabricating one circuit pattern by performing patterning plural times. The term does not embrace only a case in which one circuit pattern is built by two steps of patterning.

Figure 1:
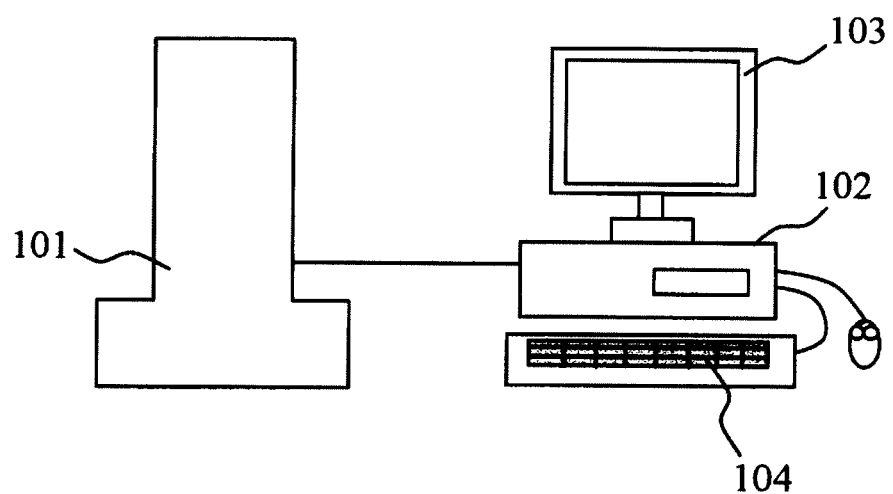
FIG. 1 is a view illustrating an electronic computer for implementing the pattern shape evaluation method of the present invention, as well as an SEM, a data input device, and a data display device connected with the computer.

FIG. 1 illustrates an example of pattern shape evaluation apparatus according to the present invention. The pattern shape evaluation apparatus of the present example has an electronic computer 102, a display device 103, and an input device 104. The electronic computer 102 has data processing units such as a CPU, a GPU, and so on, and a data recorder, and is loaded with software for implementing the pattern shape evaluation method according to the present invention.

Image data about a circuit pattern taken by a microscope 101 such as a scanning electron microscope (SEM) or optical microscope is sent to the electronic computer 102 via a network, hard disk, memory, or the like. Image data about circuit patterns and design patterns for double patterning are stored in the data recorder.

A user inputs necessary parameters via the input device 104. A pattern shape evaluation is executed by inputting run commands. Data used for pattern shape evaluation and the results of the shape evaluation are displayed on the display device 103.

Figure 2A:
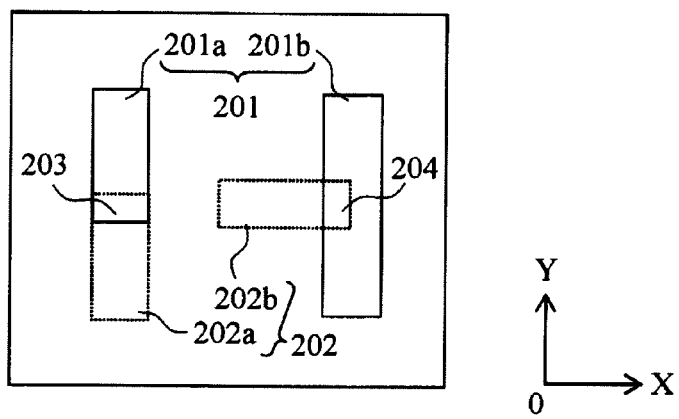
FIG. 2A is a view illustrating an example of design pattern for double patterning used in the pattern shape evaluation method of the invention.

FIG. 2A illustrates an example of design pattern for double patterning. The design pattern consists of two patterns, a first design pattern 201 indicated by the solid lines and a second design pattern 202 indicated by the broken lines. The two design patterns 201 and 202 are separately patterned to form a target circuit pattern on a wafer. In the present example, the first design pattern 201 consists of a first portion 201a and a second portion 201b. The second design pattern 202 consists of a first portion 202a and a second portion 202b. The dimension of width of the first portion 201a of the first design pattern 201 is identical with the dimension of width of the first portion 202a of the second design pattern 202.

The two design patterns 201 and 202 are joined together at two locations. In the joint portion, the two design patterns are designed to overlap each other. The first portion 201a of the first design pattern 201 and the first portion 202a of the second design pattern 202 overlap each other in a region 203. The second portion 201b of the first design pattern 201 and the second portion 202b of the second design pattern 202 overlap each other in a region 204. That is, the shape and coordinates of the design pattern are set such that the overlapping regions 203 and 204 are created. If the actual shape and position of the circuit pattern deviate from the shape and position of the design pattern, it is secured that both are joined together by providing the overlapping regions 203 and 204 in this way. In FIG. 2A, X coordinates are set in the transverse direction. Y coordinates are set in the longitudinal direction.

Figure 2B:
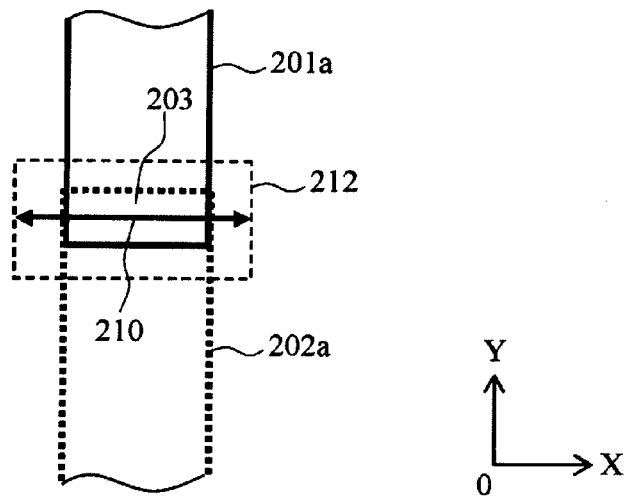
FIG. 2B is a view illustrating details of parts of an example of design pattern for double patterning used in the pattern shape evaluation method of the invention.
Figure 2C:
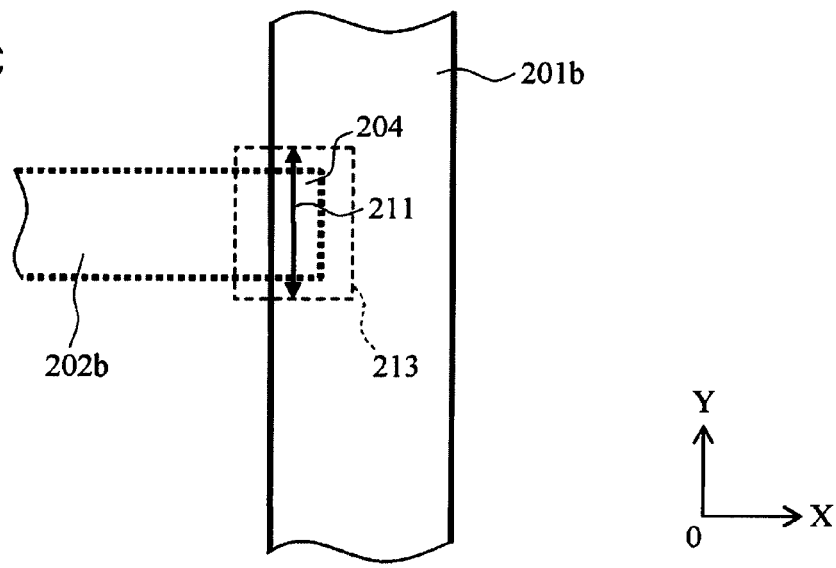
FIG. 2C is a view illustrating details of parts of an example of design pattern for double patterning used in the pattern shape evaluation method of the invention.

Target boundary lines and evaluation regions are described by referring to FIGS. 2B and 2C. FIG. 2B is a view illustrating an enlargement of a region including the overlapping region 203. FIG. 2C is a view illustrating an enlargement of a region including the overlapping region 204. Each target boundary line is a line segment of a given length specified by a designer as a target position in which the joint portion between two circuit patterns should be disposed. In the joint portion between two circuit patterns, the two circuit patterns are made to overlap each other. That is, an overlapping region is formed. Each target boundary line is design data that is set as a target position of the overlapping region of two circuit patterns. In FIGS. 2B and 2C, line segments 210 and 211 with both-sided arrows indicate the target boundary lines. The target boundary lines 210 and 211 are normally placed around the centers of the overlapping regions 203 and 204 of two design patterns. In the case of the example illustrated in FIG. 2C, the target boundary line 211 may be set along a fringe of the overlapping region 204 of the two design patterns, i.e., along a fringe of the second portion 201b of the first design pattern 201.

Each of the target boundary lines 210 and 211 has a position and a direction.

The design pattern may be obtained as the coordinates of the vertexes of a geometric pattern. In this case, the positions of the target boundary lines 210 and 211 are the coordinates of both ends or the coordinates of the centers. Where the positions of the target boundary lines 210 and 211 are represented by the coordinates of the centers, it is necessary to identify the dimensions, i.e., lengths, of the target boundary lines 210 and 211. The directions of the target boundary lines 210 and 211 are directions in which the both arrows extend. For example, where they extend along the X direction, the direction is the X direction. Where they extend along the Y direction, the direction is the Y direction. In the example illustrated in FIG. 2B, the direction of the target boundary line 210 is the X direction. In the example illustrated in FIG. 2C, the direction of the target boundary line 211 is the Y direction.

Evaluation regions 212 and 213 are rectangular regions set so as to surround the target boundary lines 210 and 211. In the illustrated example, the dimensions of the evaluation regions 212 and 213 in the longitudinal direction, i.e., the dimensions of the longer sides, are equal to the dimensions of the target boundary lines 210 and 211. The dimensions of widths of the evaluation regions 212 and 213, i.e., the dimensions of the shorter sides, are greater than the dimensions of widths of the overlapping regions 203 and 204.

The target boundary lines and evaluation regions set as design data are drawn on the image of the circuit pattern. A decision is made as to whether the circuit pattern is good or not, using the target boundary lines and evaluation regions drawn on the image of the circuit pattern. This will be described in detail hereinafter. As described later, a user may directly set the target boundary lines and evaluation regions on the image of the circuit pattern. In this case, the target boundary lines and evaluation regions are not necessary as design data.

Figure 3A:
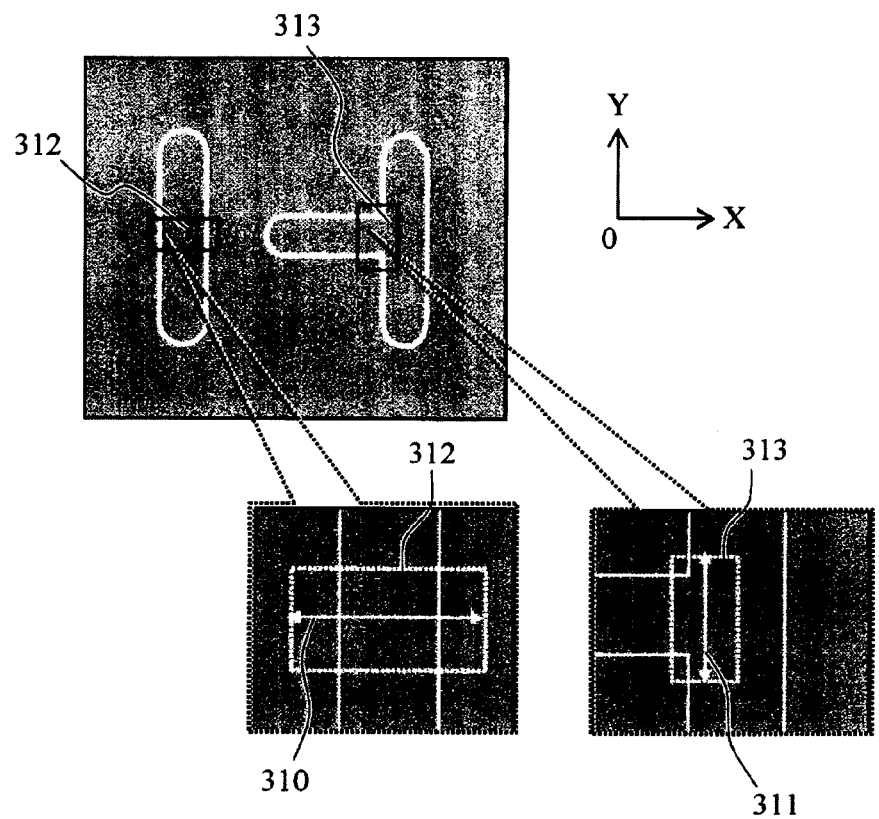
FIG. 3A is a view showing examples of circuit pattern actually fabricated by double patterning.
Figure 3B:
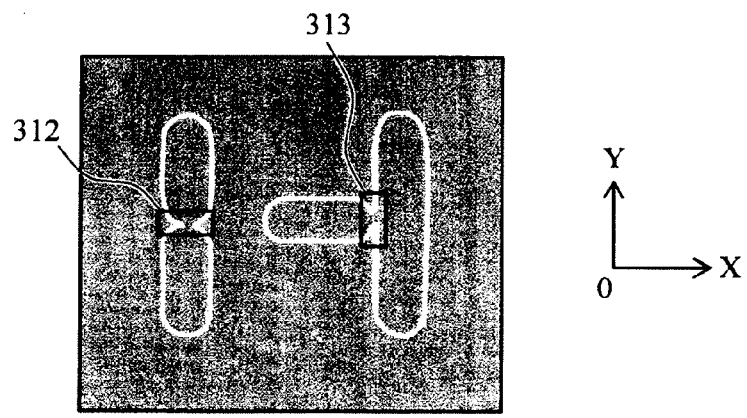
FIG. 3B is a view showing examples of circuit pattern actually fabricated by double patterning.

FIGS. 3A and 3B show examples of images of a circuit pattern actually fabricated by double patterning. The images of the circuit pattern shown in FIGS. 3A and 3B schematically show images of circuit patterns fabricated on wafers, the images being taken by the scanning electron microscope (SEM). Regions in which a circuit pattern exists (portions producing edge effects) are displayed in white color. Regions in which no circuit pattern is present are displayed in black color. This circuit pattern has been built using the design pattern illustrated in FIG. 2A. Target boundary lines 310, 311 and evaluation regions 312, 313 are drawn on the image of the circuit pattern.

In the case of the circuit pattern shown in FIG. 3A, the image of the joint portion is not interrupted in the evaluation regions 312 and 213. Furthermore, the position of the joint portion is matched to the positions of the target boundary lines 310 and 311, and therefore, this circuit pattern is good. In the case of the circuit pattern shown in FIG. 3B, the image of the joint portion is disturbed in the evaluation regions 312 and 213. Therefore, this circuit pattern is at fault.

Figure 4A:
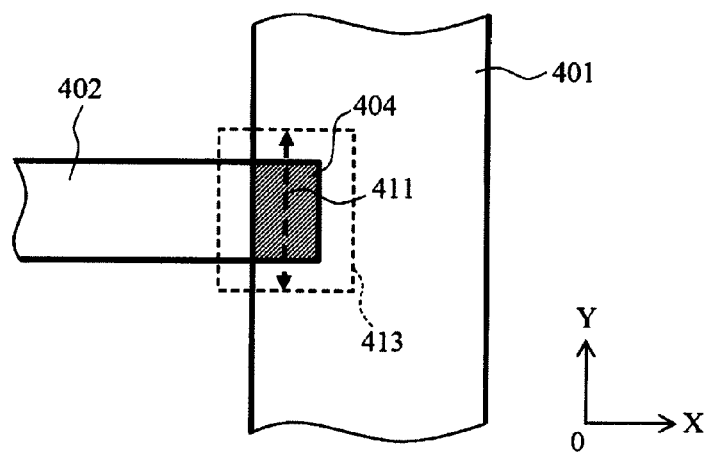
FIG. 4A is a view schematically illustrating an image of a circuit pattern fabricated by double patterning.
Figure 4B:
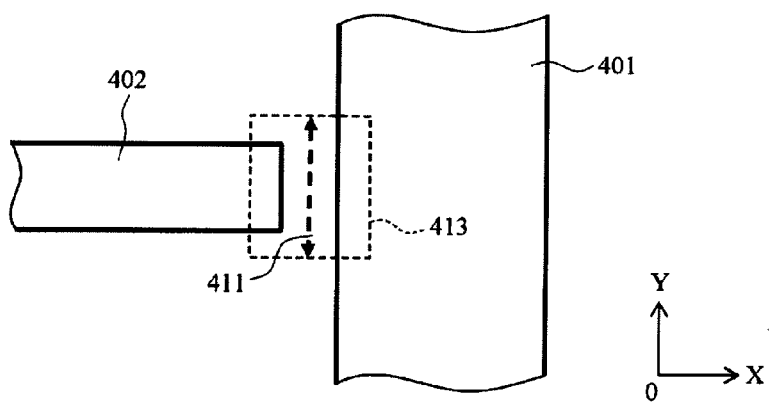
FIG. 4B is a view schematically illustrating an image of a circuit pattern fabricated by double patterning.
Figure 4C:
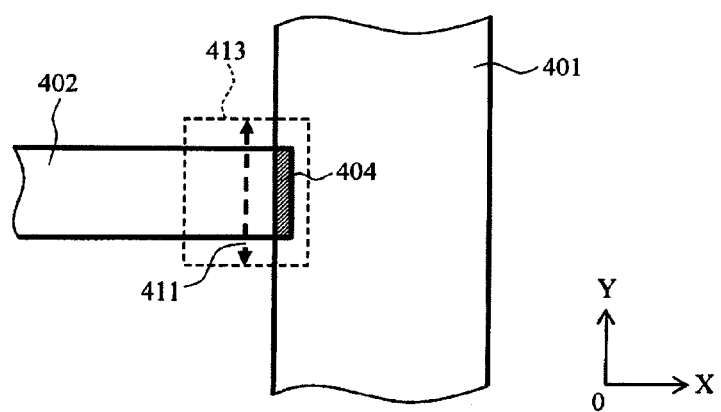
FIG. 4C is a view schematically illustrating an image of a circuit pattern fabricated by double patterning.

FIGS. 4A, 4B, and 4C schematically illustrate an image 401 of a circuit pattern owing to a first design pattern and an image 402 of a circuit pattern owing to a second design pattern. A target boundary line 411 and an evaluation region 413 for the design pattern are drawn in the images of these circuit patterns. In the example of FIG. 4A, the images 401 and 402 of the two circuit patterns overlap each other. An overlapping region 404 is placed in a position corresponding to the target boundary line 411. In addition, within the evaluation region 413, the joint portion is formed as designed. Accordingly, the circuit pattern of FIG. 4A is good. In the example of FIG. 4B, the images 401 and 402 of the two circuit patterns do not overlap. Therefore, the circuit pattern of FIG. 4B is defective, because the two circuit patterns have shifted in opposite directions along the X direction.

In the example of FIG. 4C, the images 401 and 402 of the two circuit patterns overlap each other. The overlapping region 404 deviates from the position of the target boundary line 411. However, the overlapping region 404 is disposed within the evaluation region 413, because the two circuit patterns have shifted in the X direction. If the amount of shift of the overlapping region 404 relative to the target boundary region 411 is small, it can be judged that the circuit pattern of FIG. 4C is good. Where the amount of shift is large, it can be judged that the pattern is defective.

A method of setting the target boundary lines and evaluation regions is described next. The target boundary lines and evaluation regions are normally generated as design data. The target boundary lines and evaluation regions set as design data are drawn on the image of the circuit pattern. In this way, a decision is made as to whether the circuit pattern is good or not, using the target boundary lines and evaluation regions drawn on the image of the circuit pattern. Accordingly, the positional coordinates of the target boundary lines and evaluation regions on the design coordinates need to be converted into positional coordinates on image coordinates. Therefore, the target boundary lines and evaluation regions may be created as image data from the beginning. In this case, conversion from design coordinates into image coordinates is not necessary. The evaluation regions are set based on the target boundary lines. Accordingly, if the target boundary lines are set, the evaluation regions can be set easily based on them.

First, a method of setting the target boundary lines as design data is described. The target boundary lines may be set at will by the user while referring to the geometric figure of the design pattern displayed on the display device. Alternatively, the electronic computer 102 may automatically set the lines from the design data about the pattern. Here, a method of automatically setting the target boundary lines by the electronic computer 102 is described. As described previously, in design patterns for double patterning, the two design patterns are designed so as to overlap each other at their joint portion. That is, there is an overlapping region. The overlapping region is normally rectangular.

Information permitting each design pattern to be discerned in what patterning process it is used is registered in the design data for double patterning. Generally, design data is data describing the coordinates of the vertexes of geometric patterns.

Therefore, the coordinates of the vertexes of the overlapping region can be easily found by superimposing the coordinates of the vertexes of the two design patterns. If the coordinates of the vertexes of the overlapping region are found in this way, target boundary lines are set based on them. The target boundary lines are set at the center or at a side of the overlapping region. Where the lines are set at the center of the overlapping region, the target boundary line is set so as to be parallel to the longer sides of the rectangle forming the overlapping region. The lengths of the target boundary lines are previously set. In this way, the positions and directions of the target boundary lines can be set. The positions of the target boundary lines may be displayed as the coordinates of both ends or may be displayed as the coordinates of the central positions. Where the positions of the target boundary lines are displayed as the coordinates of the central positions, it is necessary to identify the lengths.

Instead of representing the coordinates of vertexes, the design data may be represented in μm, nm, or the like by the distance from a reference point on design coordinates to a vertex or side of the pattern. In this case, the positions of the target boundary lines are represented by the distances from the reference point on design coordinates. Also in this case, in cases where the positions of the target boundary lines are displayed as the coordinates of the central positions, it is necessary to identify the lengths.

A method of setting evaluation regions is described next. The evaluation regions are set based on the target boundary lines. The evaluation regions may be set at will by the user while referring to the target boundary lines displayed on the display device. Alternatively, the electronic computer 102 may automatically set them from the design data about the target boundary lines. A method of automatically setting the evaluation regions by the electronic computer 102 is now described.

As described previously, each evaluation region is a rectangular region that is set so as to surround the target boundary lines. The dimensions of the evaluation regions have been previously set. Accordingly, if the coordinates of both ends of the target boundary lines are given, the coordinates of the vertexes of the evaluation regions can be easily computed. In a case where the central positions and the dimensions of the target boundary lines are given, the coordinates of the vertexes of the evaluation regions can be similarly computed easily.

A method of setting the target boundary lines and evaluation regions that are image data is described next. The user may set at will the target boundary lines and evaluation regions as parameters while referring to the image of the circuit pattern displayed on the display device. Alternatively, the electronic computer 102 may automatically set them from design data about the target boundary lines and evaluation regions. A method of computing image data about the target boundary lines and evaluation regions from design data by the electronic computer 102 is described here.

It is assumed that the positions of both ends of each target boundary line and the positions of the four vertexes of each evaluation region are given as positions on design coordinates. In this case, the positions of the target boundary lines and evaluation regions on the image are determined, using corresponding point information about design coordinates and image coordinates. The corresponding point information includes coordinate information about a reference point on image coordinates and about a corresponding reference point on design coordinates, as well as the pixel size of the image. First, a reference point B on image coordinates is found, the point B corresponding to a reference point A on design data. Then, the distance from the reference point A measured on the design coordinates to the position of the target boundary line is converted into a distance on image coordinates. For this conversion, the pixel size is employed. The position of the target boundary line on image coordinates is obtained by measuring the distance obtained by the conversion from the reference point B on image coordinates. The same theory is applied in a case where the position of each evaluation region is set on image coordinates.

The corresponding point information may be specified as parameters by the user. The information can also be automatically detected by making use of corresponding point searching processing such as pattern matching. The pattern matching processing is processing for creating a template for a pattern to be searched for, detecting a pattern of the shape identical or similar to the shape of the template within the image of the searched subject, and finding the position. For example, a region near the joint portion in a design pattern including the reference point A is cut off from the design data, and a template is created. The template is produced by imaging a region including a part of the design pattern based on the pixel size found from the magnification used when the image is taken. On the image, the position of a pattern that resembles the template image most closely is detected by pattern matching processing. If the position of the template is detected on the image in this way, the coordinates of the reference point B on the image corresponding to the reference point A contained in it can be found.

As described previously, in some cases, the positions of both ends of each target boundary line and the positions of the four vertexes of each evaluation region are represented as distances from a reference point on design coordinates. In this case, the target boundary lines and the positions of the evaluation regions on image coordinates are found by converting the distances on design coordinates into distances on image coordinates. That is, the positional coordinates of the target boundary lines and evaluation regions are obtained as image data in which the distances from a reference point on the image to the target boundary lines are expressed in terms of the number of pixels or subpixels.

Figure 5:
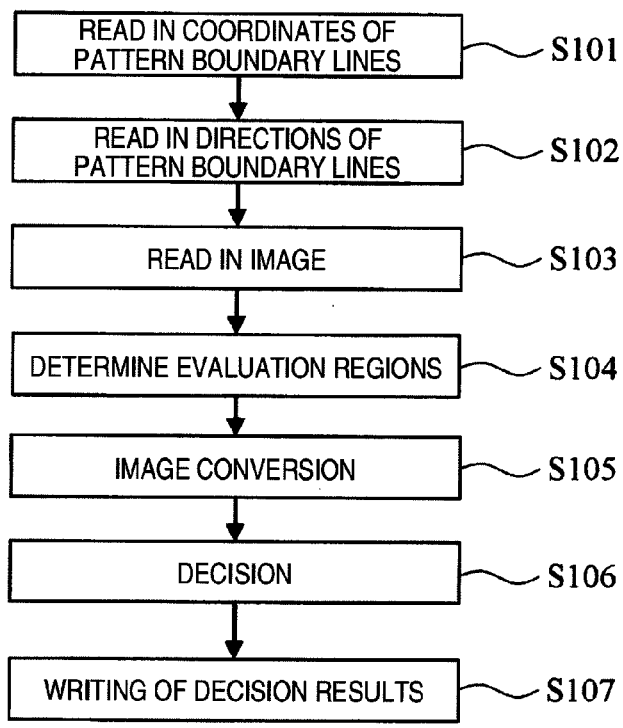
FIG. 5 is a chart illustrating a first example of the pattern shape evaluation method according to the present invention.

A first example of the method of the pattern shape evaluation method according to the present invention is described by referring to FIG. 5. First, in step S101, the coordinates of the target boundary lines of design data are read in from the data recorder of the electronic computer 102. Then, in step S102, the directions of the target boundary lines are read in from the data recorder of the electronic computer 102. As described previously, each target boundary line is a line segment of a given length specified by the designer as a target position in which the joint portion of two circuit patterns is to be disposed.

The coordinates and directions of the target boundary lines may be specified as parameters by the user while referring to the pattern shape of the design data. They may also be automatically specified by analysis of the design pattern by a computer.

Then, in step S103, an original image obtained by shooting the joint portion of the circuit patterns is read in from the data recorder of the electronic computer 102. Then, in step S104, evaluation regions are specified within the original image based on the positions of the target boundary lines. The evaluation regions may be specified as parameters by the user while referring to the target boundary lines set on the image. Alternatively, they may be automatically specified by analysis of the design pattern by the computer.

Then, in step S105, image conversion processing and binarization processing are performed in the evaluation regions. First, moving average processing is performed along the directions of the target boundary lines in the evaluation regions of the original image. It is easy to judge whether the joint portion of the two circuit patterns has a defect by performing the image conversion processing on the original image. The moving average processing of an image is given by Equation (1).

$$[\text{MATH.1}] \quad d(x,y) = \Sigma v(x+j, y+i)/n \quad \text{(Equation 1)}$$

Where d (x, y) is a pixel value of the result of the moving average processing, v (x, y) is a pixel value centered at the pixel to be processed and existing along the directions of the target boundary lines, and n is the number of pixels to be averaged with respect to brightness values. That is, each pixel to be treated is replaced by the average value of pixel values existing in the pattern average direction and centered about the pixels to be treated.

The direction of the moving average computation is the direction of the target boundary lines. However, as illustrated in FIGS. 4B and 4C, in some cases, no overlapping region exists in the joint portion of circuit patterns. In other cases, an overlapping region is shifted from the target boundary lines. Accordingly, moving average processing may be performed by making a shift, for example, in increments of 1 degree in the directions of +/−45° with respect to the direction of the target boundary lines. The results of the moving average in the moving average direction in which the presence of a circuit pattern is emphasized to the greatest extent can also be used for a good/bad decision as described later.

Then, binarization processing is performed in each evaluation region of an image after image conversion processing. The binarization processing is to convert pixel values, whose gray levels are represented by moving average processing, into white pixels if they are equal to or higher than a certain threshold value, and into black pixels if they are smaller than the threshold value. The technique of binarization processing is not restricted to this, since many other techniques exist such as a method of automatically determining a threshold value from a distribution of appearance frequencies at which pixel values exist in an area (=evaluation region) to be binarized is available as a technique of binarization processing, and a method in which the threshold value is specified by the user.

In this way, in the present example, moving average processing is performed along the directions of the target boundary lines, and further binarization processing is effected. Therefore, in a case where circuit patterns are obscured by noise contained in the image, the existence of the circuit patterns can be emphasized.

Then, in step S106, a decision is made as to whether there is a defect pattern. That is, a decision is made as to whether or not the pattern is defective from the image subjected to image conversion processing and to binarization processing. The simplest method of decision is to search each evaluation region for the presence of white pixels. If there exist white pixels, they are judged as a defect portion of the pattern. Details of step S106 will be described later with reference to FIG. 7. In step S107, the result of the decision as to whether the evaluation region has a defect, its state (interrupted, broken, or the like), and the result of the decision regarding the length of the broken interval are written into the data recorder of the electronic computer 102.

As described so far, according to the present invention, a precise and simple method can be used to judge whether the pattern joint portion has a pattern defect and to know the state of the defect and the length of the broken interval if there is a break.

Figure 7:
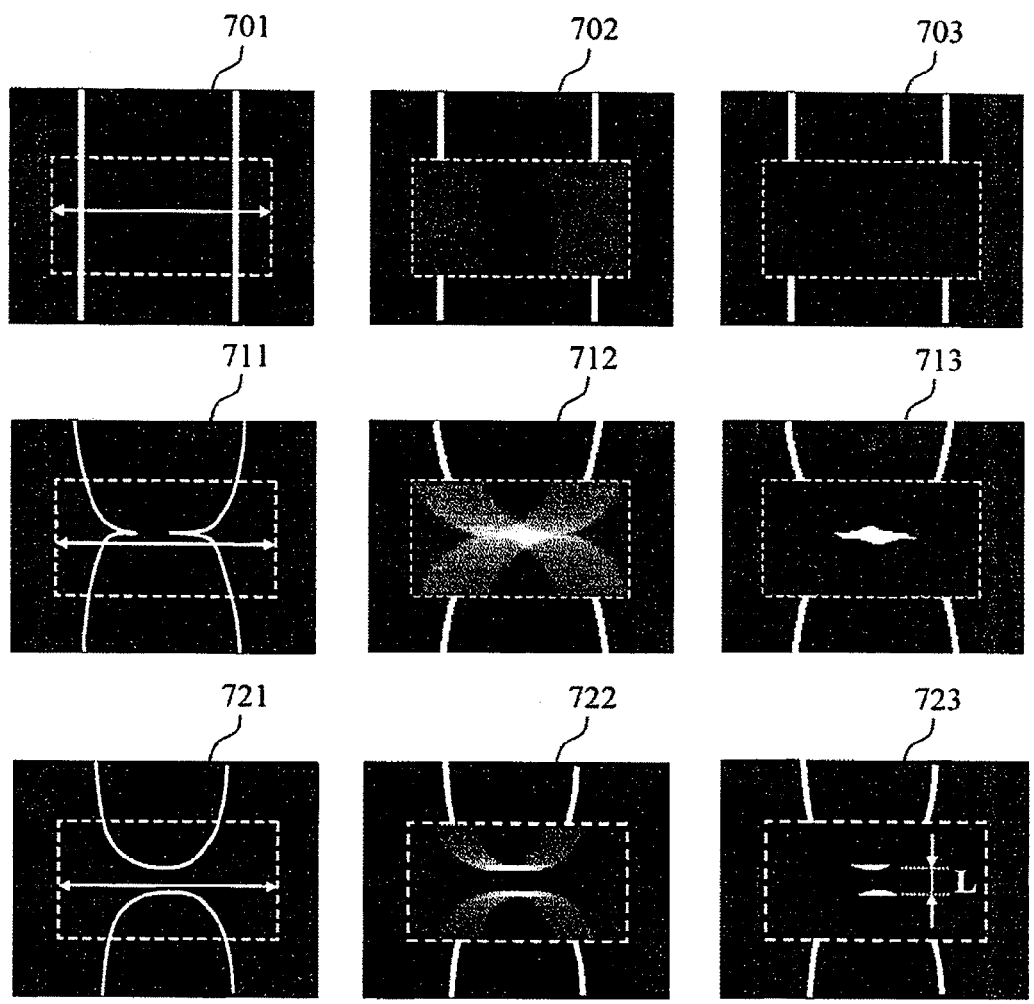
FIG. 7 is a view showing examples of shot image of circuit pattern joint portions.

FIG. 7 shows examples of shot image of the joint portions of circuit patterns. The rectangles of broken lines indicate evaluation regions. Solid lines with both-sided arrows indicate the direction of a target boundary line. Images 701, 711, and 721 indicate examples of original image of the joint portions of circuit patterns. The image 701 shows an image of a normal, defect-free joint portion of circuit patterns. An image 702 shows an image of a joint portion of circuit patterns, the joint portion having a defect. An image 703 shows an image of circuit patterns that have been completely cut off.

Images 702, 712, and 722 show images obtained as a result of moving average processing performed in the direction of the target boundary line on all pixels in evaluation regions of the images 701, 711, and 721. In the image 701, there is no pattern defect and so there is not any pattern that is continuous in the direction of the target boundary line. Therefore, if moving average processing is performed, the brightness values of the pattern are averaged out. As shown in the image 702, the brightness values in the evaluation region are overall small values. In the images 711 and 712, the patterns have defects and so there exists a pattern that is continuous in the direction of the target boundary line. Therefore, as shown in the images 712 and 722, the images of the patterns having defects are emphasized by the moving average processing. Some brightness values in the evaluation region have large values. Especially, as in the image 711, a pattern interruption tends to be produced under a pattern sidewall. It is difficult to image such an interruption as a clear pattern. However, as shown in the image 712, an image capable of withstanding a pattern shape evaluation can be generated owing to the moving motion processing.

Images 703, 713, and 723 show images obtained as a result of binarization of all the pixels in evaluation regions of the images 702, 712, and 722 undergone moving average processing. The binarization makes it possible to make clear the presence or absence of patterns having defects.

Another method of shape evaluation is described. As shown in the image 721 of FIG. 7, in a case where a pattern has completely dropped out, if moving average processing and binarization processing are performed, the result is that two clusters of white pixels are present within the evaluation region as shown in the image 723 of FIG. 7. Therefore, a decision as to whether the pattern is interrupted can be made and its state (immediately prior to interruption or completed broken) can be discerned by counting the number of clusters of white pixels existing in the evaluation region. In particular, as shown in the image 703, in a case where there is not any cluster of white pixels within the evaluation region, it can be determined that there is no pattern defect. In a case where there is one cluster of white pixels as shown in the image 713, it can be determined that there is a pattern defect. Where there are two clusters of white pixels as shown in the image 723, it can be determined that there is a line break.

Furthermore, where there exist two clusters of pattern as shown in the image 723 of FIG. 7, the length of the broken interval of the pattern can be found. That is, within each cluster, a pixel position (peak) at which there is the highest moving averaged pixel value is found. The peak-to-peak distance L within each cluster is measured in units of pixels or subpixels. This distance L is the length of the broken interval of the pattern.

Figure 6:
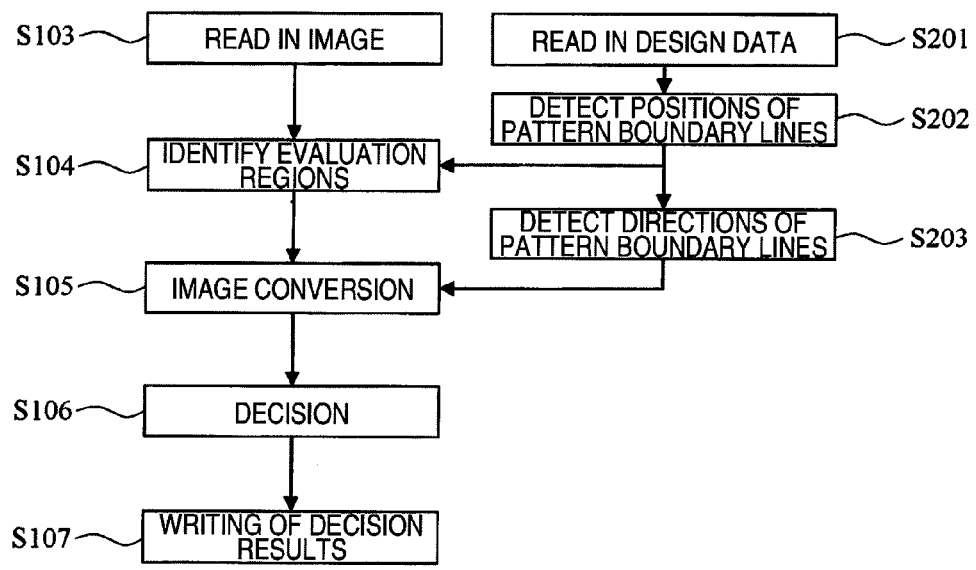
FIG. 6 is a chart illustrating a second example of the pattern shape evaluation method according to the present invention.

A second example of pattern shape evaluation method according to the present invention is described by referring to FIG. 6. In the present example, extraction of the coordinates of a target boundary line and extraction of the direction of the target boundary line are done automatically. In other respects, this example may be similar to the first example shown in FIG. 5. Only processing for the extraction of the coordinates of the target boundary line and the extraction of the direction of the target boundary line is described here.

First, in step S201, design data including design data about the pattern joint portion is read in from the data recorder of the electronic computer 102. Then, in step S202, the position of the target boundary line is identified from the design data, and its coordinates are detected. Then, in step S203, the direction of the detected target boundary line is detected. The method of identifying the position and direction of the target boundary line by the electronic computer 102 is as described previously. Setting of the evaluation region of step S104 is done using the position of the target boundary line that has been automatically extracted from the design data as described so far. Image conversion of step S105 is done by making use of the direction of the target boundary line. The decision of step S106 and the writing of the decision result of step S107 are similar to the first example of FIG. 5.

As described previously, according to the present invention, the burden on the user in making a shape evaluation of the pattern joint portion can be suppressed by automatically extracting the target boundary line and the direction of the target boundary line from the design data.

Figure 8:
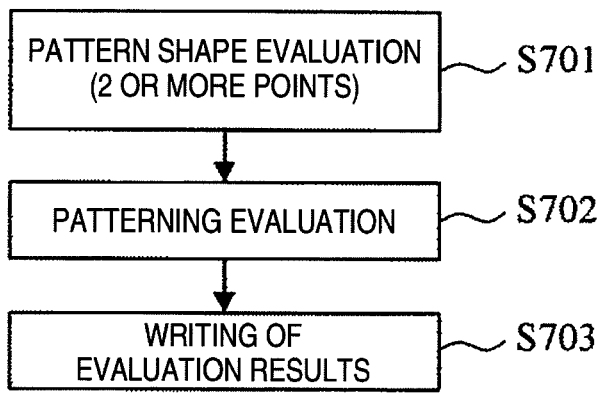
FIG. 8 is a chart illustrating an example of a method of generating patterning evaluation data and recording the data, the method being according to the invention.

An example of the method of generating patterning evaluation data and recording it in a manner according to the present invention is described by referring to FIG. 8. In two or more evaluation regions of a circuit pattern formed on a wafer, the pattern shape evaluation shown in the first example of FIG. 5 is made in step S701. In step S702, patterning evaluation data indicating the performance of patterning on the wafer is generated from the shape evaluation data obtained in step S701. A method of generating the patterning evaluation data will be described later by referring to FIG. 9. In step S703, the results are written into the data recorder of the electronic computer 102.

Figure 9:
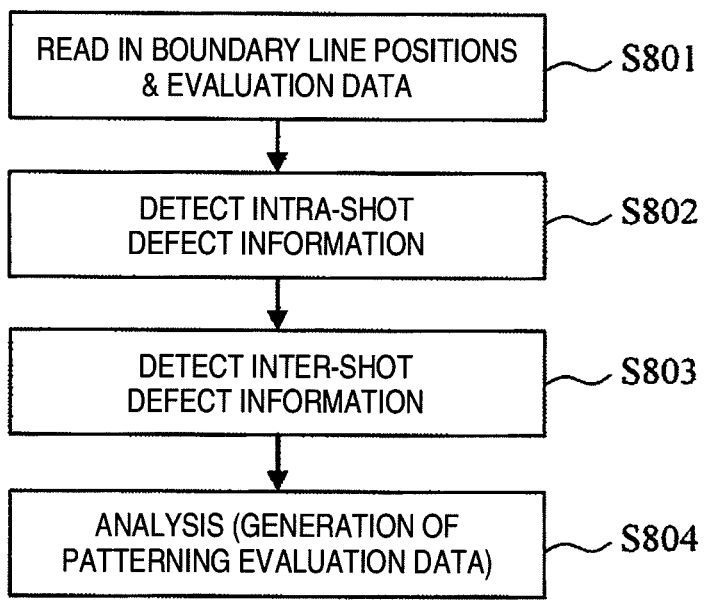
FIG. 9 is a chart illustrating a method of generating patterning evaluation data according to the invention.

The method of generating the patterning evaluation data according to the present invention is described by referring to FIG. 9. First, in step S801, design coordinates of the position of the target boundary line for which a pattern shape evaluation has been done and evaluation data about the coordinates are read in. In a case where the position of the target boundary line is obtained as image coordinates, it is necessary that the image coordinates are made to correspond to the design coordinates either by matching with the design pattern or manually and that the design coordinates of the position of the target boundary line are found.

Then, in step S802, defect information about a pattern inside a shot (patterned region on the wafer) is found.

Figure 10A:
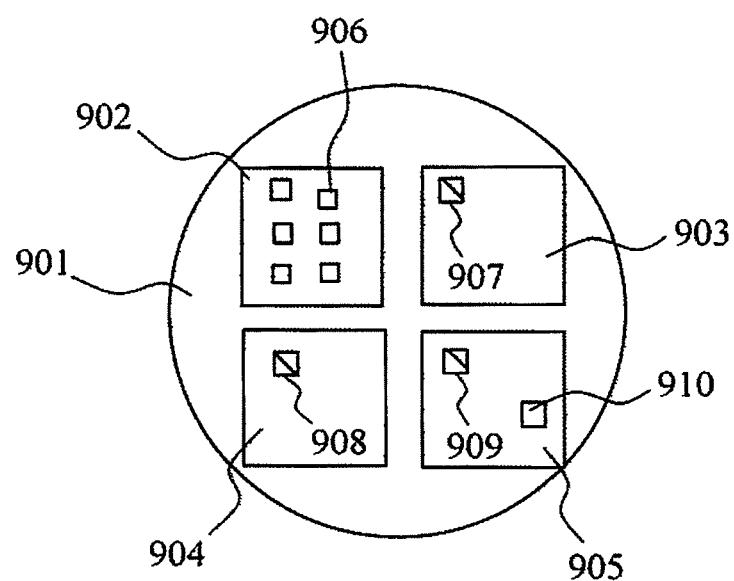
FIG. 10A is a view illustrating the positional relationship among shot regions on a patterning evaluation data wafer and pattern defects in accordance with the invention.

FIG. 10A is a view illustrating the positional relationships among shot regions 902-905 on a wafer 901 and target boundary lines 906-910 which have been found to have pattern defects. In some cases, there are many pattern defects like the shot 902. In other cases, there are few pattern defects like the shot 904. Data for discriminating shots where there are many such pattern defects from shots where there are not many pattern defects is found as pattern defect information within each shot. The simplest method of finding the pattern defect information within the shot is to count the number of pattern defects within each shot.

Then, in step S803, the tendency of the positions of pattern defects is detected within each shot. For example, in the shots 903, 904, and 905 for which pattern defects have been confirmed, pattern defects are confirmed in all of the corresponding positions 907, 908, and 909 of the target boundary lines. On the other hand, at the positions of the target boundary lines of other shots corresponding to the position 910 of the target boundary line of the shot 905 for which a pattern defect has been confirmed, pattern defects are not confirmed. For many shots, pattern joint portions having pattern defects can be discerned. For almost all shots, pattern joint portions having no pattern defects can be discerned.

In this way, inter-shot pattern defect information adapted for discriminating the data about pattern joint portions tending to produce defects from the data about joint portions rarely producing defects can be found. The simplest method of finding the inter-shot pattern defect information is to count the number of pattern defects in the joint portions of other shots corresponding to the pattern joint portions producing pattern defects.

In step S804, the pattern defect information within shots and the inter-shot pattern defect information found as described so far is analyzed and the cause of the pattern defects is estimated. For example, where many pattern defects occur in a shot, it is highly likely that the cause of the pattern defects is patterning misalignment. Further, where similar pattern defects are observed between shots, it is highly likely that the causes of the pattern defects are insufficient margin in the design pattern and the shape of the design pattern. In cases where none of the foregoing cases apply, there is a high possibility that randomly generated defects such as adhesion of foreign matter are the causes. One example of such a case is that pattern defects are present within a shot in an isolated state and no defect occurs in the positions of the target boundary lines of other shots corresponding to the positions of the defects of that pattern.

As described so far, the causes of defects in the patterns existing on a wafer (misalignment of patterns, shape of design data, and random defects) can be estimated by analyzing the information about pattern defects within and among the shots. The results of the estimation and data used for the estimation are written as patterning estimation data into the data recorder of the electronic computer 102. Parameters for a threshold value are used to make a decision as to whether the number of pattern defects is large or small. It is assumed that the threshold value can be specified by the user.

Figure 10B:
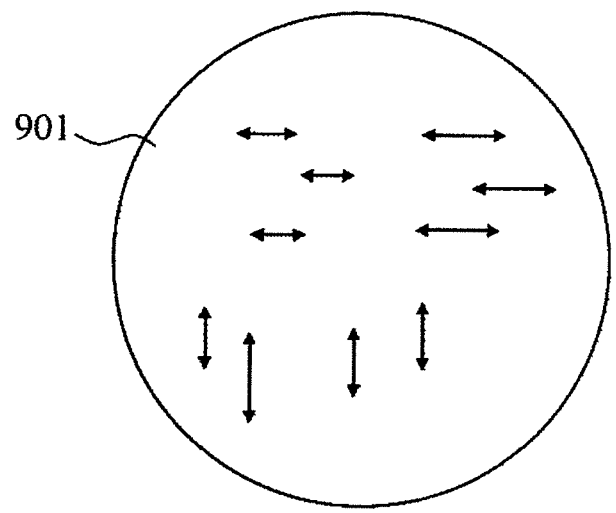
FIG. 10B is a view illustrating the positional relationship among shot regions on a patterning evaluation data wafer and pattern defects in accordance with the invention.

The user can easily recognize the state of patterning on a wafer by creating patterning evaluation data that is either data obtained by bit-mapping the positions of pattern defects existing on a wafer as illustrated in FIG. 10A or data obtained by bit-mapping data indicating the intervals of interruptions of patterns existing on the wafer as illustrated in FIG. 10B or the average value of the intervals within a local region and by displaying the data on the display device 103 connected with the electronic computer 102.

As described so far, according to the present invention, the results of the evaluation of the shape of a pattern joint portion are analyzed, and data that can be used for the evaluation of patterning results are automatically created. Thus, the efficiency of the work for evaluating patterning results can be improved.

While examples of the present invention have been described so far, the invention is not restricted to the foregoing examples. It would be easy for the skilled in the art to appreciate that various modifications are possible within the scope of the invention set forth in the claims.

REFERENCE SIGNS LIST

101: microscope;
102: electronic computer;
103: display device;
104: input device;
201, 202: design patterns;
203, 204: overlapping regions;
210, 211: target boundary lines;
212, 213: evaluation regions;
401, 402: images of circuit patterns;
411: target boundary line;
413: evaluation region

The invention claimed is:

1. A pattern shape evaluation method of evaluating a circuit pattern using a data storage device which stores data, an arithmetic unit which processes data, an input device permitting a user to perform input processing, and a display device which displays image data, said pattern shape evaluation method comprising:

reading out a design pattern used for double patterning and including at least two design patterns from said data storage device;

reading out an image of a joint portion of circuit patterns fabricated using said design pattern for double patterning from said data storage device;

setting a target boundary line specified along a direction of an edge of a joint portion of two circuit patterns which are jointed in design data as a target position in which said joint portion of said two circuit patterns should be disposed in said image of the joint portion of circuit patterns;

setting an evaluation region specified for image processing to be performed in a next image processing step;

performing image processing along a direction of said target boundary line in the evaluation region set on the image of the circuit patterns;

performing binarization processing in said evaluation region after performing said image processing; and making a decision as to whether or not the circuit patterns have defects based on an image obtained after performing said binarization processing, wherein during said image processing, a moving average value of pixel values is computed along said target boundary line in said evaluation region and along a direction within ±45 degrees with respect to the direction of the target boundary line.

2. The pattern shape evaluation method of claim 1, wherein in said step of making a decision as to whether or not the circuit patterns have defects, if there are no clusters of white pixels within said evaluation region, it is determined that there are no circuit pattern defects, and if there are clusters of white pixels, it is determined that there are circuit pattern defects within said evaluation region.

3. The pattern shape evaluation method of claim 1, further comprising a step of creating bit map data indicating a state of distribution of pattern defects within the patterned region from images of joint portions of a plurality of circuit patterns.

4. The pattern shape evaluation method of claim 1, wherein said target boundary line and said evaluation region are set by converting the target boundary line and evaluation region, which have been previously set as a design pattern, into image data displayed on the image of the joint portion of the two circuit patterns.

5. The pattern shape evaluation method of claim 4, wherein said target boundary line set as the design data is set in the center or on a fringe of an overlapping region in the joint portion of two design patterns.

6. The pattern shape evaluation method of claim 1, wherein said target boundary line and evaluation region are set manually by a user on the image of the joint portion of said circuit patterns.

7. The pattern shape evaluation method of claim 1, wherein said evaluation region is set as a rectangular region so as to embrace said target boundary line.

8. A pattern shape evaluation apparatus having a data storage device which stores data, an arithmetic unit which processes data, an input device permitting a user to perform input processing, and a display device which displays image data,
wherein data storage device stores design patterns used for double patterning and including at least two design patterns and an image of a joint portion of circuit patterns fabricated using said design pattern for double patterning,
wherein said arithmetic unit reads out the image of the joint portion of the circuit patterns from said data storage device, sets a target boundary line specified along a direction of an edge of a joint portion of two circuit patterns which are jointed in design data as a target position in which the joint portion of the two circuit patterns should be disposed in said image of the joint portion of circuit patterns, sets an evaluation region specified to permit image processing in a next image processing step, performs image processing along a direction of the target boundary line in the evaluation region, performs binarization processing in the evaluation region after performing the image processing, and makes a decision as to whether or not the patterns have defects based on the image after performing the binarization step, and
wherein during said image processing, said arithmetic unit calculates moving average values of pixel values along a direction of said target boundary line in said evaluation region and along a direction within ±45 degrees with respect to the direction of the target boundary line.

9. A pattern shape evaluation apparatus having a data storage device which stores data, an arithmetic unit which processes data, an input device permitting a user to perform input processing, and a display device which displays image data,
wherein said data storage device stores design patterns used for double patterning and including at least two design patterns and an image of a joint portion of circuit patterns fabricated using said design pattern for double patterning,
wherein said arithmetic unit reads out the image of the joint portion of the circuit patterns from said data storage device, sets a target boundary line specified along a direction of an edge of a joint portion of two circuit patterns which are jointed in design data as a target position in which the joint portion of the two circuit patterns should be disposed in said image of the joint portion of circuit patterns, and sets an evaluation region specified to permit image processing in a next image processing step, performs image processing along a direction of the target boundary line in the evaluation region, performs binarization processing in the evaluation region after performing the image processing, makes a decision as to whether or not the circuit patterns have defects based on the image after performing the binarization step, and creates bit map data indicating a state of distribution of circuit pattern defects in a patterned region, and
wherein during said image processing, said arithmetic unit calculates moving average values of pixel values along the direction of said target boundary line in said evaluation region and along a direction within ±45 degrees with respect to the direction of the target boundary line.

10. The pattern shape evaluation apparatus of claim 9, wherein said arithmetic unit identifies regions prone to production of circuit pattern defects from said bit map data.

11. A pattern shape evaluation method of evaluating a circuit pattern using a data storage device which stores data, an arithmetic unit which processes data, an input device permitting a user to perform input processing, and a display device which displays image data, said pattern shape evaluation method comprising:
reading out a design pattern used for double patterning and including at least two design patterns from said data storage device;
reading out an image of a joint portion of circuit patterns fabricated using said design pattern for double patterning from said data storage device;
setting a target boundary line specified as a target position in which a joint portion of two circuit patterns should be disposed;
setting an evaluation region specified for image processing to be performed in a next image processing step;
performing image processing along a direction of said target boundary line in the evaluation region set on the image of the circuit patterns;
performing binarization processing in said evaluation region after performing said image processing; and
making a decision as to whether or not the circuit patterns have defects based on an image obtained after performing said binarization processing,
wherein in said step of making a decision as to whether or not the circuit patterns have defects, if there are no clusters of white pixels within said evaluation region, it is determined that there are no circuit pattern defects, if there is one cluster of white pixels within said evaluation region, it is determined that there are circuit pattern defects, and if there are two clusters of white pixels within said evaluation region, it is determined that there is a break in the circuit pattern.

12. A pattern shape evaluation method of evaluating a circuit pattern using a data storage device which stores data, an arithmetic unit which processes data, an input device permitting a user to perform input processing, and a display device which displays image data, said pattern shape evaluation method comprising:
reading out a design pattern used for double patterning and including at least two design patterns from said data storage device;

reading out an image of a joint portion of circuit patterns fabricated using said design pattern for double patterning from said data storage device;

setting a target boundary line specified as a target position in which a joint portion of two circuit patterns should be disposed;

setting an evaluation region specified for image processing to be performed in a next image processing step;

performing image processing along a direction of said target boundary line in the evaluation region set on the image of the circuit patterns;

performing binarization processing in said evaluation region after performing said image processing; and making a decision as to whether or not the patterns have defects based on an image obtained after performing said binarization processing, wherein in said step of making a decision as to whether or not the circuit patterns have defects, if there are two clusters of white pixels within said evaluation region, it is determined that there is a break in the circuit patterns, and dimensions of the break in the circuit patterns are found by measuring a distance between the clusters of white pixels in terms of pixels and subpixels.

13. A pattern shape evaluation apparatus having a data storage device which stores data, an arithmetic unit which processes data, an input device permitting a user to perform input processing, and a display device which displays image data, wherein data storage device stores design patterns used for double patterning and including at least two design patterns and an image of a joint portion of circuit patterns fabricated using said design pattern for double patterning, wherein said arithmetic unit reads out the image of the joint portion of the circuit patterns from said data storage device, sets a target boundary line specified as a target position in which the joint portion of two circuit patterns should be disposed, sets an evaluation region specified to permit image processing in a next image processing step, performs image processing along a direction of the a target boundary line in the evaluation region, performs binarization processing in the evaluation region after performing the image processing, and makes a decision as to whether or not the patterns have defects based on the image after performing the binarization step, and wherein, when said decision is made as to whether or not the circuit patterns have defects, said arithmetic unit determines that there are no circuit pattern defects if there are no clusters of white pixels within said evaluation region, that there are circuit pattern defects if there is one cluster of white pixels within the evaluation region, and that there is a break in the circuit patterns if there are two clusters of white pixels within the evaluation region.

* * * * *